United States Patent
Giovannini et al.

(10) Patent No.: US 9,141,472 B2
(45) Date of Patent: Sep. 22, 2015

(54) SHARING A CHECK BIT MEMORY DEVICE BETWEEN GROUPS OF MEMORY DEVICES

(75) Inventors: Thomas J. Giovannini, San Jose, CA (US); Ian Shaeffer, Los Gatos, CA (US)

(73) Assignee: Rambus Inc., Sunnyvale, CA (US)

( * ) Notice: Subject to any disclaimer, the term of this patent is extended or adjusted under 35 U.S.C. 154(b) by 161 days.

(21) Appl. No.: 13/610,675

(22) Filed: Sep. 11, 2012

(65) Prior Publication Data

US 2013/0086449 A1    Apr. 4, 2013

Related U.S. Application Data

(60) Provisional application No. 61/541,321, filed on Sep. 30, 2011.

(51) Int. Cl.
  G11C 29/00    (2006.01)
  G06F 11/10    (2006.01)
  H03M 13/09    (2006.01)

(52) U.S. Cl.
  CPC ........... *G06F 11/1044* (2013.01); *H03M 13/09* (2013.01)

(58) Field of Classification Search
  USPC ........................................................ 714/763
  See application file for complete search history.

(56) References Cited

U.S. PATENT DOCUMENTS

| | | | |
|---|---|---|---|
| 7,363,422 B2 | 4/2008 | Perego et al. | |
| 7,464,225 B2 | 12/2008 | Tsern | |
| 7,519,894 B2 | 4/2009 | Weiβ et al. | |
| 7,836,378 B2 | 11/2010 | Shaeffer et al. | |
| 7,949,931 B2 | 5/2011 | Lastras-Montano | |
| 2002/0029315 A1* | 3/2002 | Williams et al. | 711/105 |
| 2007/0011574 A1* | 1/2007 | Weiss et al. | 714/763 |
| 2008/0040559 A1* | 2/2008 | Wolford et al. | 711/150 |
| 2010/0217915 A1 | 8/2010 | O'Connor et al. | |
| 2011/0016278 A1 | 1/2011 | Ware et al. | |
| 2011/0209030 A1* | 8/2011 | Lee et al. | 714/758 |

OTHER PUBLICATIONS

Author: Xun Jian, Rakesh Kumar; Title: ECC Parity: A Technique for Efficient Memory Error Resilience for Multi-Channel Memory Systems; Publisher: IEEE; Nov. 16-21, 2014, New Orleans, Louisiana, USA.*

* cited by examiner

*Primary Examiner* — April Y Blair
*Assistant Examiner* — Thien D Nguyen
(74) *Attorney, Agent, or Firm* — Fenwick & West LLP

(57) ABSTRACT

A memory system that supports error detection and correction (EDC) coverage. The memory system includes a memory module with at least two groups of memory devices that store data and another memory device that stores error checking information (e.g., Error Correcting Code) for both groups of memory devices. The memory module also includes a memory buffer that determines an address for accessing the error checking information based on whether data is transferred with the first group of memory devices or the second group of memory devices. Alternatively, the memory controller may determine the address for accessing the error checking information to reduce or eliminate the need for a memory buffer.

34 Claims, 10 Drawing Sheets

| Thread | Col | S1# | S0# | Half Rank | Primary Column Address (via PCA) | Data Column Address (via SCA) | Error Column Address (via ECA) |
|---|---|---|---|---|---|---|---|
| 0 | 0 | 1 | 0 | 0 | ...xyz0 | ...xyz0 | No Access |
| 0 | 1 | 1 | 0 | 0 | ...xyz1 | ...xyz1 | ...xyz1 |
| 1 | 0 | 0 | 1 | 1 | ...xyz0 | ...xyz0 | No Access |
| 1 | 1 | 0 | 1 | 1 | ...xyz1 | ...xyz1 | ...xyz0 |

| Thread | Col | S1# | S0# | Half Rank | Primary Column Address (via PCA) | Data Column Address (via SCA) | Error Column Address (via ECA) |
|---|---|---|---|---|---|---|---|
| 0 | 0 | 1 | 0 | 0 | ...xyz0 | ...xyz0 | ...xyz1 |
| 0 | 1 | 1 | 0 | 0 | ...xyz1 | ...xyz1 | No Access |
| 1 | 0 | 0 | 1 | 1 | ...xyz0 | ...xyz0 | ...xyz0 |
| 1 | 1 | 0 | 1 | 1 | ...xyz1 | ...xyz1 | No Access |

FIG. 2B

| Thread | Col | S01# | S00# | Half Rank | Quarter Rank | Primary Column Address (via PCA) | Data Column Address (via SCA) | Error Column Address (via ECA) |
|---|---|---|---|---|---|---|---|---|
| 0 | 0 | 1 | 0 | 0 | 0 | ...xy00 | ...xy00 | No Access |
| 0 | 1 | 1 | 0 | 0 | 0 | ...xy01 | ...xy01 | ...xy01 |
| 0 | 2 | 1 | 0 | 0 | 0 | ...xy10 | ...xy10 | No Access |
| 0 | 3 | 1 | 0 | 0 | 0 | ...xy11 | ...xy11 | ...xy11 |
| 1 | 0 | 0 | 1 | 0 | 1 | ...xy00 | ...xy00 | No Access |
| 1 | 1 | 0 | 1 | 0 | 1 | ...xy01 | ...xy01 | ...xy00 |
| 1 | 2 | 0 | 1 | 0 | 1 | ...xy10 | ...xy10 | No Access |
| 1 | 3 | 0 | 1 | 0 | 1 | ...xy11 | ...xy11 | ...xy10 |

FIG. 5A

| Thread | Col | S01# | S00# | Half Rank | Quarter Rank | Primary Column Address (via PCA) | Data Column Address (via SCA) | Error Column Address (via ECA) |
|---|---|---|---|---|---|---|---|---|
| 0 | 0 | 1 | 0 | 0 | 0 | ...xy00 | ...xy00 | ...xy01 |
| 0 | 1 | 1 | 0 | 0 | 0 | ...xy01 | ...xy01 | No Access |
| 0 | 2 | 1 | 0 | 0 | 0 | ...xy10 | ...xy10 | ...xy11 |
| 0 | 3 | 1 | 0 | 0 | 0 | ...xy11 | ...xy11 | No Access |
| 1 | 0 | 0 | 1 | 0 | 1 | ...xy00 | ...xy00 | ...xy00 |
| 1 | 1 | 0 | 1 | 0 | 1 | ...xy01 | ...xy01 | No Access |
| 1 | 2 | 0 | 1 | 0 | 1 | ...xy10 | ...xy10 | ...xy10 |
| 1 | 3 | 0 | 1 | 0 | 1 | ...xy11 | ...xy11 | No Access |

SHARING A CHECK BIT MEMORY DEVICE BETWEEN GROUPS OF MEMORY DEVICES

BACKGROUND

The present disclosure relates to memory systems, and more specifically to components of a memory system that include error detection and correction (EDC) functionality.

BRIEF DESCRIPTION OF THE DRAWINGS

The teachings of the embodiments of herein can be readily understood by considering the following detailed description in conjunction with the accompanying drawings.

FIG. 2A is a table illustrating the operation of the address circuit during write operation in the embodiment of FIG. 1, according to an embodiment.

FIG. 2B is a table illustrating the operation of the address circuit during read operation in the embodiment of FIG. 1, according to an embodiment.

FIG. 5A is a table illustrating the operation of the address circuit of the embodiment of FIG. 4 during write operation, according to an embodiment.

FIG. 5B is a table illustrating the operation of the address circuit of the embodiment of FIG. 4 during read operation, according to an embodiment.

DETAILED DESCRIPTION OF EMBODIMENTS

Embodiments of the present disclosure relate to components of a memory system that support error detection and correction (EDC) coverage for detecting and correcting memory errors that may arise during memory accesses. In one embodiment, a memory module includes two groups of memory devices that store data and another memory device that stores error checking information (e.g., Error Correcting Code) for both groups of memory devices. The memory module also includes a memory buffer that handles communications between the memory module and a memory controller. The memory buffer may support memory threading or dynamic point to point (DPP) memory configurations so that the data in one group of memory devices can be accessed independently of the data in another group of memory devices. To support independent data accesses while sharing a memory device for the error checking information, the buffer determines an address for accessing the error checking information based on whether data is transferred with the first group of memory devices or the second group of memory devices. In some embodiments, the functionality described as being in the memory buffer may instead be implemented in the memory controller to reduce or eliminate the need for a memory buffer.

Note that the term "error checking information" throughout this disclosure is broadly defined as any information that can be used or associated with detecting and/or correcting an error that occurs within the data stored in a memory system. Moreover, the term "Error Correcting Code" (ECC) throughout this specification refers to error checking information used in a memory system for error detection and correction.

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

Figure 1:
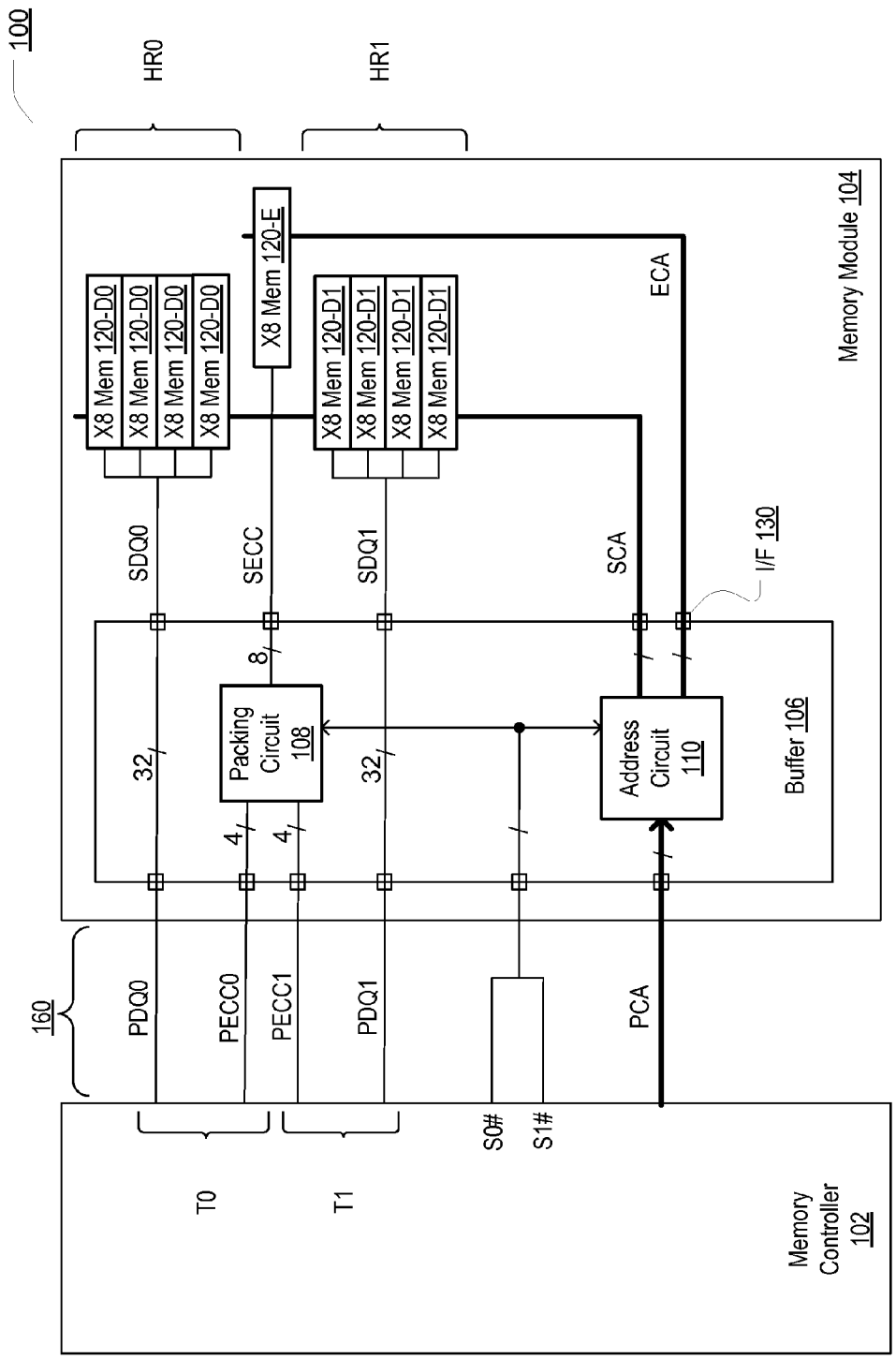
FIG. 1 illustrates a memory system for EDC coverage, according to one embodiment.

FIG. 1 illustrates a memory system 100 for EDC coverage, according to one embodiment. The memory system 100 includes a memory controller 102 and a memory module 104 interconnected via a primary signaling link 160. In one embodiment, system 100 may reside on a motherboard. The memory controller 102 may be a discrete integrated circuit or be a portion of a larger integrated circuit such as a central processing unit (CPU) or graphics processing unit (GPU).

The primary signaling link 160 includes a primary command and address link PCA that carries control and address information from the memory controller 102 to the memory module 104. The signaling link 160 also includes two primary data links PDQ0 and PDQ1 for transferring data between the memory controller 102 and the memory module 104. In one embodiment, primary data links PDQ0 and PDQ1 are each 32 bits wide. The primary signaling link 160 also includes two primary ECC links PECC0 and PECC1 for transferring ECC between the memory controller 102 and the memory module 104. In one embodiment, ECC links PECC0 and PECC1 are each 4 bits wide.

The memory controller 102 supports module threading, which refers to the technique of dividing a single, relatively wide memory channel, into two sub-channels that can be accessed independently of each other through a common address bus. For example, when memory threading is enabled, the memory controller 102 divides memory transactions (e.g., read and write transactions) into two threads: T0 and T1. Data for thread T0 is transferred via the PDQ0 link, and ECC for thread T0 is transferred via the PECC0 link. Data for thread T1 is transferred via the PDQ1 link, and ECC for thread T1 is transferred via the PECC1 link. The memory controller 102 controls the memory transactions by transmitting command and address information via the PCA link and selecting one of the threads for the transaction using the two active-low select signals S0# and S1#. For example, thread T0 is selected if S0# is asserted and thread T1 is selected if S1# is asserted. In other embodiments, the memory controller 102 may select the thread with in-band signaling via the PCA link or through other sideband signals.

The memory module 104 includes a total of nine memory devices 120. Consistent with its ordinary and customary meaning, a memory device 120 is an integrated circuit device (i.e. a chip) in which information can be stored and retrieved electronically. Each memory device 120 is an x8 memory device supporting an 8 bit wide interface. Four of the memory devices 120-D0 form a half rank HR0 of memory devices that store data for thread T0. Four of the memory devices 120-D1 form another half rank HR1 of memory devices that store data for thread T1. Memory device 120-E stores ECC for both thread T0 and T1 and is effectively "shared" between the two half ranks HR0 and HR1 of memory devices. Additionally, memory devices 120 may represent any type of memory, such as dynamic random access memory (DRAM), static random access memory (SRAM), or non-volatile memory (NVM).

The memory module 104 also includes a memory buffer 106 that enables EDC functionality in conjunction with module threading. In some embodiments, memory buffer 106 is a single integrated circuit device attached to the memory module 104. The memory buffer 106 handles communications between the memory controller 102 and memory devices 120. Specifically, the memory buffer 106 transfers data with the half ranks HR0 and HR1 of memory devices through secondary data links SDQ0 and SDQ1 and controls the half ranks HR0 and HR1 through the secondary command/address link SCA. In some embodiments, the SCA link may be divided into two links, each one dedicated to one half of the memory devices 120-D. For example, there may be one command and address link dedicated to half rank HR0 and a different command and address link dedicated to half rank HR1.

The memory buffer 106 transfers ECC with the shared memory device 120-E through secondary ECC link SECC and controls the shared memory device 120-E through the ECC command/address link ECA. In other embodiments, the shared memory device 120-E may be coupled to most of the signals in the SCA link (e.g., addr[13:1]) while only receiving a single address signal from the ECA link (e.g., addr[0]). This allows the shared memory device 120-E to share most of the command/address signals with the SCA link, but to receive its own unique address bit that may be different from the corresponding address bit in the SCA link. In another embodiment, the shared memory device 120-E may share the SCA link and have a dedicated chip select signal for reading commands from the SCA link.

Address circuit 110 is also coupled to each of the memory devices 120 through secondary select signals (not shown) that are generated by the address circuit 110. Each memory device 120 processes incoming commands if its select signal is asserted, and ignores incoming commands if its select signal is de-asserted. The devices in half rank HR0 may be provided with one select signal, the devices in half rank HR1 may be provided with another select signal, and the shared memory device 120-E may be provided with a different select signal. In one embodiment, the address circuit 110 may derive the select signals from the logic levels of the primary select signals S0# and S1#.

The memory buffer 106 also includes interface circuitry (e.g., I/F 130) that receives and transmits information via the various communication links (e.g., PDQ0, PDQ1, PECC0, PECC1, SDQ0, SDQ1, SECC, PCA, SCA, ECA, etc). For example, the memory buffer 106 has an interface for communicating with half rank HR0 via the SDQ0 link, an interface for communicating with half rank HR1 via the SDQ1 link, and an interface for communicating with device 120-E via the SECC link. It is understood that any incoming or outgoing communications to or from the buffer 106 described herein are performed via such interfaces (e.g., I/F 130).

During memory transactions, the memory controller 102 issues column commands (e.g., read or write commands) to the buffer 106 via the PCA link requesting access to column addresses. As used herein, a column operation refers to the column command and the transfer of information associated with that column command. The memory controller 102 also asserts one of the two select signals S0# or S1# to indicate the active thread (e.g., T0 or T1) for the column access. Since the data portion of a thread is 32 bits wide, a single transaction to the thread consists of two consecutive column operations in order to maintain an overall 64 byte transfer, assuming a burst length of 8 bits (BL8) (i.e., each column command is associated with a 32 bit wide, 8 bit long burst of data). Similarly, since the ECC portion of the thread is 4 bits wide, the two consecutive column operations maintain an overall 8 byte data transfer for BL8 bursts.

During write transactions, the memory buffer 106 receives the data via one of PDQ0 or PDQ1 as two consecutive 32 bit wide BL8 bursts, and writes the data to one of the half ranks HR1 or HR2 of memory devices with two consecutive 32 bit wide BL8 bursts. For example, data for thread T0 is received via PDQ0 and written to half rank HR0. However, before the ECC is written into the shared memory device 120-E, the packing circuit 108 performs a 1:2 packing of the two consecutive 4 bit wide BL8 bursts to convert them into a single 8 bit wide BL8 burst. For example, ECC may be received via the PECC0 link as two consecutive 4 bit wide BL8 bursts and then written to the shared memory device 120-E with a single 8 bit wide BL8 burst. So, for each pair of data bursts between the memory buffer 106 and the memory devices 120-D, there is one ECC burst between the memory buffer 106 and the shared memory device 120-E.

Read transactions are similar to write transactions, but during read transactions the packing circuit 108 performs a 2:1 unpacking of ECC read from the shared memory device 120-E to convert a single 8 bit wide burst received via the SECC link into two consecutive 4 bit read bursts. The 4 bit wide bursts are transmitted to the memory controller 102 via either the PECC0 or PECC1 link, depending on active thread as indicated by the logic levels of the select signals S0# and S1#. Generally speaking, the packing circuit is thus responsible for translating ECC of one bit width into ECC of a larger or smaller bit width.

The address circuit 110 controls the transfer of information (i.e. data and ECC) between the buffer 106 and the memory devices 120. Specifically, the address circuit 110 receives two consecutive column addresses via the PCA link ("primary addresses") for each memory transaction and re-transmits the column addresses via the SCA link. These column addresses for accessing the data ("data addresses") transmitted via the SCA link indicate the location of the data in one of the half ranks of memory devices. Because the ECC access with the shared memory device 120-E only needs a single column address, the address circuit 110 determines a column address for the ECC access by deriving a single column address from the two primary addresses. The column address for the ECC access ("error address") indicates the location of the ECC in the shared memory device 120-E associated with the data read from or written to the selected half rank of memory devices, or the selected thread.

The address circuit 110 derives the error address differently depending on whether the data transfer is directed at the devices in half rank HR0 or half rank HR1. In one embodiment, the address circuit 110 may use the two select inputs S0# and S1# as an indication of whether the transaction is for thread T0 or thread T1 (which also indicates whether the transaction is for HR0 or HR1) and use this indication to modify one or more bits of an incoming primary address to generate an error address. For example, if the transaction is a write to thread T0, the primary address may not be modified at all (i.e. the bit values are retained) in generating the error address. If the transaction is a write to thread T1, one of the bits in the primary address may be inverted to generate the error address. By determining an address for the ECC access based on the half rank of devices being accessed for the data transfer, addressing conflicts between the two threads are avoided and a single ECC memory device 120-E can be shared between two threads.

FIGS. 2A and 2B are tables illustrating the operation of the address circuit 110 in the embodiment of FIG. 1, according to an embodiment. Specifically, FIG. 2A illustrates the operation of the address circuit 110 during write transactions and FIG. 2B illustrates the operation of the address circuit 110 during read transactions. Both figures will be explained by reference to FIG. 1.

Referring now to FIG. 2A, shown is a table 200 that illustrates the operation of the address circuit 110 during write transactions. The first two rows of the table 200 show consecutive column write operations for thread T0. S0# (an active low signal) is asserted and S1# is de-asserted to indicate that the column operations are associated with thread T0 and half rank HR0. The first column operation is to primary column address " . . . xyz0" and the second column operation is to primary column address " . . . xyz1." Both primary column addresses are received via the PCA link and provided as data addresses via the SCA link to half rank HR0 without any changes. There is no write operation to the shared ECC device 120-E during the first column operation since the packing circuit 108 starts the packing process during this period. During the second column operation, the address circuit 110 provides the second column address of " . . . xyz1" as an error address via the ECA link without any changes to perform the 8 bit wide burst to the shared ECC device 120-E.

The last two rows of the table 200 show consecutive column write operations for thread T1. S1# is asserted and S0# is de-asserted to indicate that column operations are for thread T1 and half rank H1. The first column operation is to primary column address " . . . xyz0" and the second column operation is to primary column address " . . . xyz1." Both column addresses are received via the PCA link and provided as data addresses via the SCA link to half rank HR1 without any changes. As before, there is no write operation to the shared ECC device 120-E during the first column operation since the packing circuit 108 starts the packing process during this period. However, during the second column operation, the address circuit 110 inverts the least significant bit (LSB) of the primary column address and provides this modified column address as the error address via the ECA link. Thus, column address " . . . xyz1" is converted into column address " . . . xyz0" for writing the ECC to the shared ECC device 120-E.

Referring now to FIG. 2B, shown is a table 205 that illustrates the operation of the address circuit 110 during read transactions. FIG. 2B is similar to FIG. 2A, but during read transactions the error address is provided to the shared ECC device 120-E with the first column operation so that the packing circuit 108 can start the un-packing process during the first column operation. Additionally, the address circuit 110 inverts the LSB of a primary column address to generate an error address when accessing ECC for thread T0, and uses the primary column address directly when accessing ECC for thread T1.

The first two rows of the table 205 show consecutive column read operations for thread T0. S0# is asserted to indicate that the column operations are for thread T0 and half rank HR0. The first column operation is to primary column address " . . . xyz0" and the second column operation is to column address " . . . xyz1." Both primary column addresses are received on the PCA link and provided as data addresses via the SCA link to half rank HR0 without any changes. During the first column operation, the address circuit 110 inverts the LSB of the primary column address and provides this modified column address as an error address via the ECA link. Thus, column address " . . . xyz0" is converted into column address " . . . xyz1" for reading ECC from the shared ECC device 120-E, consistent with where the ECC was written in the shared ECC device 120-E during the second column operation for thread T0 in the table of FIG. 2A. There is no error address provided to the shared ECC device 120-E during the second column operation because the ECC was already transferred during the first column operation.

The second two rows of the table 205 show consecutive column read operations to thread T1. S1# is asserted to indicate that the column operations are for thread T1 and half rank HR1. The first column operation is to primary column address " . . . xyz0" and the second column operation is to primary column address " . . . xyz1." Both column addresses are received via the PCA link and provided via the SCA link as data addresses to half rank HR1 without any changes. During the first column operation, the address circuit 110 re-transmits the primary column address as an error address via the ECA link without any changes for reading ECC from the shared ECC device 120-E, consistent with where the ECC was written in the shared ECC device 120-E during the second column operation for thread T1 in the table of FIG. 2A. There is no address provided to the shared ECC device 120-E during the second column operation because the ECC was already transferred during the first column operation.

In other embodiments, the address circuit 110 may invert a column bit other than the LSB of the primary address when generating the error addresses for the ECC accesses. For example, the address circuit 110 may be configured to invert the most significant bit (MSB) and/or any other bit between the LSB and MSB.

Figure 3A:
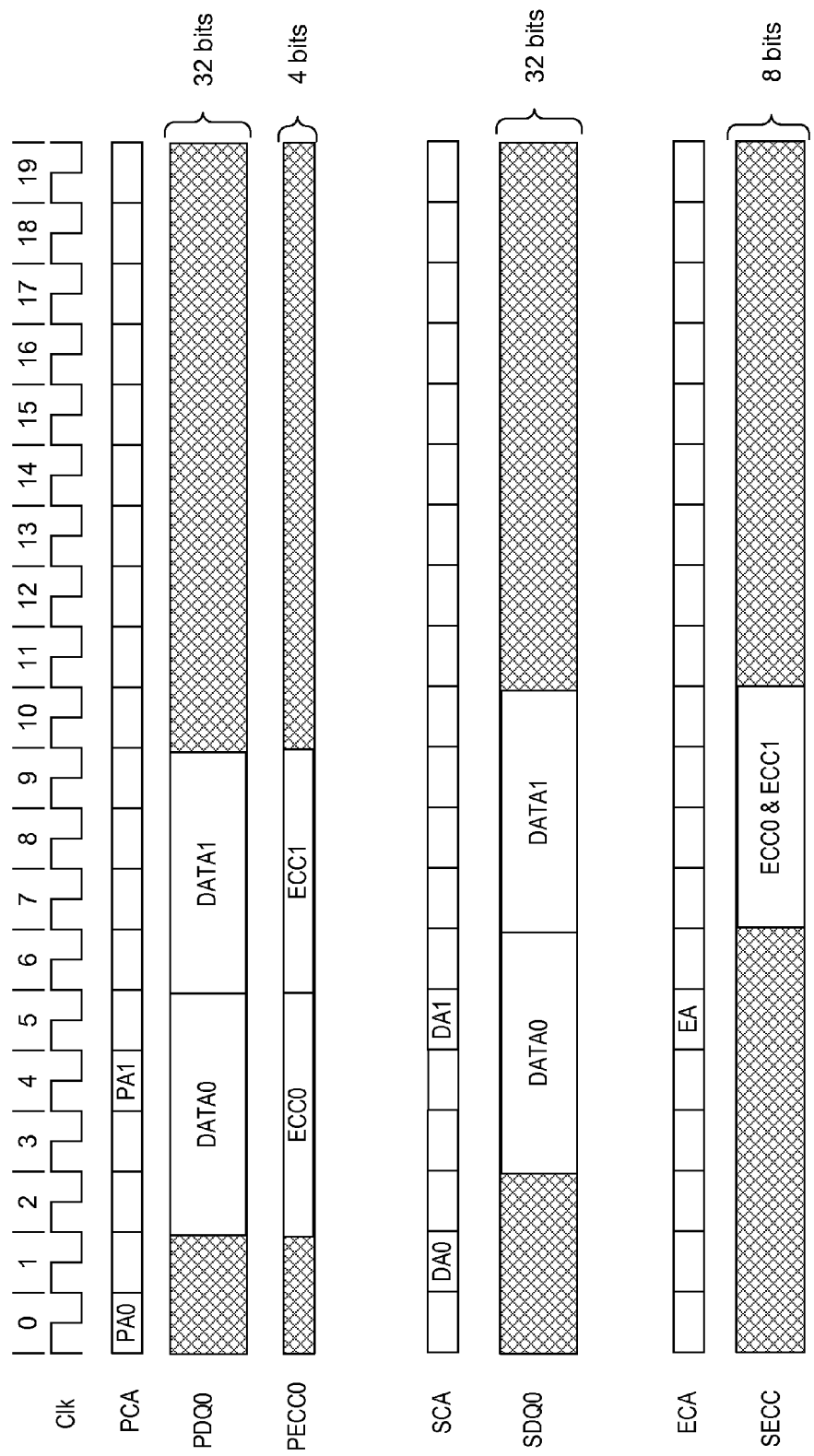
FIG. 3A is a timing diagram illustrating the operation of the memory system during write operation in the embodiment of FIG. 1, according to an embodiment.
Figure 3B:
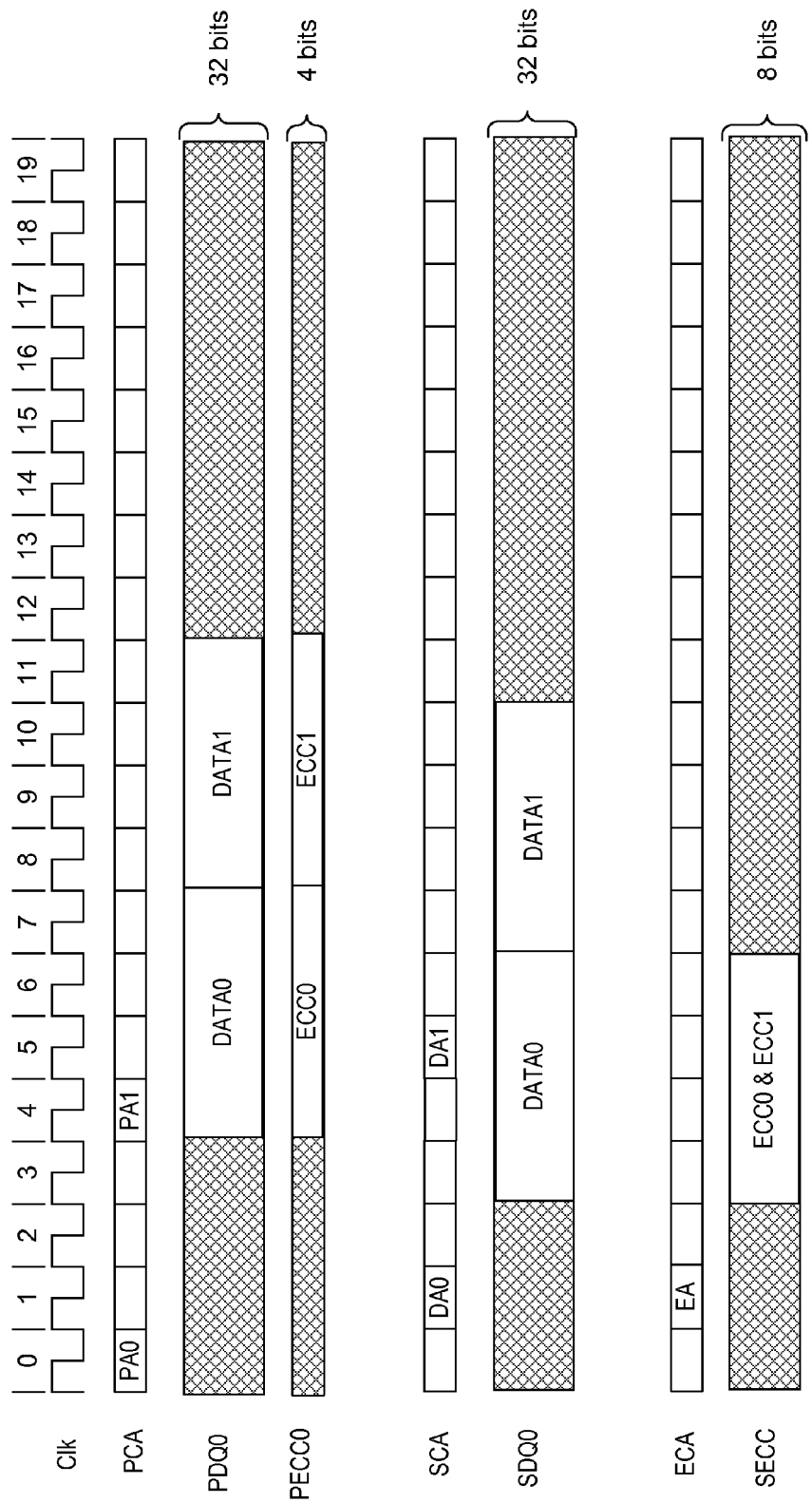
FIG. 3B is a timing diagram illustrating the operation of the memory system during read operation in the embodiment of FIG. 1, according to an embodiment.

FIGS. 3A and 3B are timing diagrams illustrating the operation of the memory system 100 of the embodiment of FIG. 1, according to an embodiment. Specifically, FIG. 3A is a timing diagram for the memory system 100 during write transactions and FIG. 3B is a timing diagram for the memory system 100 during read transactions. Both figures will be explained by reference to the FIG. 1, FIG. 2A, and FIG. 2B.

Referring now to FIG. 3A, shown is a timing diagram for the memory system 100 during write transactions for thread T0. The timing diagram corresponds to the first two rows of the table 200 from FIG. 2A. Clk is a timing signal that may be part of the PCA link, but is represented separately in the timing diagram for use as a point of reference.

The memory controller 102 provides two primary addresses, PA0 and PA1, via the PCA link as part of two consecutive column operations. The memory buffer 106 receives the two primary addresses, PA0 and PA1, and re-transmits the primary addresses as two data addresses, DA0 and DA1, via the SCA link without any changes after a short delay. Because this is a write operation for thread T0, the memory buffer 106 uses the second primary address PA1 as the error address EA that is transmitted via the ECA link. The error address EA is accessed at substantially the same time as the second data address DA1. Note that if this were a write transaction for thread T1, the memory buffer 106 would invert a bit in the second primary address PA1 and provide the modified address via the ECA link as the error address EA.

The memory controller 102 provides two bursts of data, DATA0 and DATA1, via the PDQ0 link. Each burst of data is 32 bits wide and has a burst length of 8 bits, assuming the system uses double data rate (DDR) transmission. DATA0 is the data for the first column operation to PA0, and DATA1 is the data for the second column operation to PA1. The memory buffer 106 receives the data via the PDQ0 link and re-transmits the data via the SDQ0 link after a short delay. DATA0 is stored into half rank HR0 at data address DA0. DATA1 is stored into half rank HR0 at data address DA1.

Additionally, the memory controller 102 provides two bursts of ECC, i.e., ECC0 and ECC1, via the PECC0 link. Each burst of ECC is 4 bits wide and 8 bits long. ECC0 can be used to check DATA0 for errors, and ECC 1 can be used to check for DATA1 for errors. Packing circuit 108 packs ECC0 and ECC1 together so that they can be stored during a single column operation. The buffer 106 then transmits ECC0 and ECC1 via the SECC link with a single 8 bit wide, 8 bit long burst. ECC0 and ECC1 are both stored into the shared ECC device 120-E at error address EA.

Referring now to FIG. 3B, shown is a timing diagram for the memory system 100 during read transactions for thread T0. The timing diagram corresponds to the first two rows of the table 205 from FIG. 2B. Similar to FIG. 3A, the memory controller 102 provides two primary addresses, PA0 and PA1, via the PCA link as part of two consecutive column operations. The memory buffer 106 receives the two primary addresses, PA0 and PA1, via the PCA link and re-transmits them as two data addresses DA) and DA1, via the SCA link without any changes after a short delay. However, because this is a read operation for thread T0, the memory buffer 106 inverts a bit of the first primary address, PA0, and transmits the modified address as the error address EA via the ECA link. The error address is accessed at substantially the same time as the first data address. Note that if this were a read transaction to thread T1, the error address EA would have the same bit values as the first primary address PA0.

The buffer 106 receives two bursts of data, DATA0 and DATA1, from the devices in half rank HR0 via the SDQ0 link in response to the data addresses, DA0 and DA1. Each burst of data is 32 bits wide and 8 bits long. DATA0 is read from column address DA0, and DATA1 is read from column address DA1. The memory buffer 106 then re-transmits the data, DATA0 and DATA1, to the memory controller 102 via the PDQ0 link after a short delay.

Additionally, the buffer 106 receives a single 8 bit wide, 8 bit long burst of ECC that includes ECC0 and ECC1, from the shared memory device 120-E via the SECC link. ECC0 and ECC1 are both read from error address EA. Packing circuit 108 unpacks the ECC so that it can be transferred to the memory controller 102 with two separate bursts. The buffer 106 then transmits ECC0 and ECC1 via the PECC0 link with two 4 bit wide, 8 bit long bursts, at substantially the same timing as when DATA0 and DATA1 are read on PDQ0.

In one embodiment, memory transactions for thread T1 are performed in a similar manner to the memory transactions shown in FIG. 3A and FIG. 3B. However, data would be transferred via data links PDQ1 and SDQ1 instead of data links PDQ0 and SDQ0. Additionally, ECC would be transferred via primary ECC link PECC1 instead of link PECC0.

Figure 4:
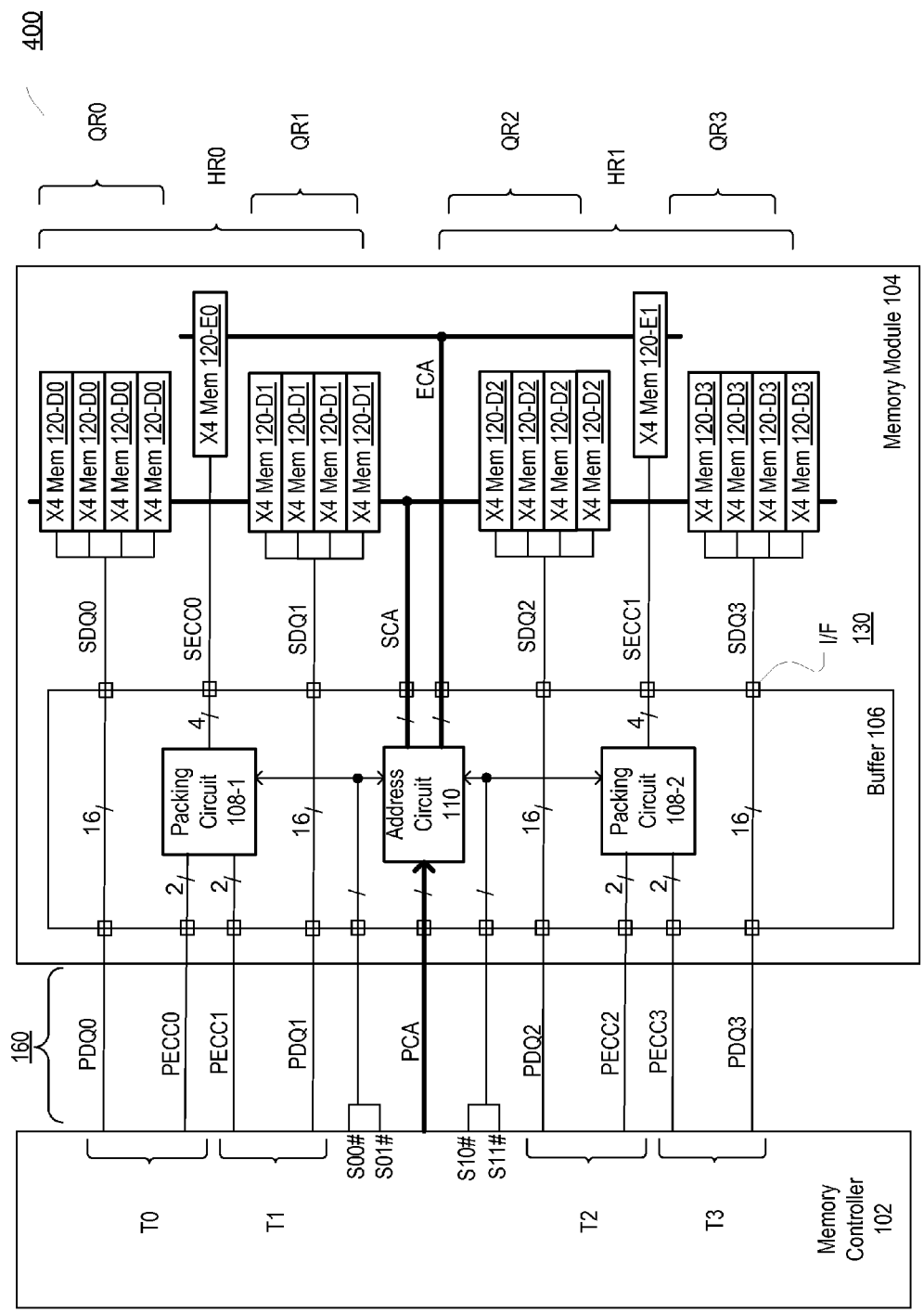
FIG. 4 illustrates a memory system for EDC coverage, according to another embodiment.

FIG. 4 illustrates a memory system 400 for EDC coverage, according to another embodiment. FIG. 4 is similar to FIG. 1, but the memory controller 102 in FIG. 4 supports four threads (T0, T1, T2, T3) and memory module 104 includes twice as many memory devices 120; a total of sixteen memory devices 120-D for data and two memory devices 120-E for ECC. Data for thread T0 is transferred via the PDQ0 link, and ECC for thread T0 is transferred via the PECC0 link. Data for thread T1 is transferred via the PDQ1 link, and ECC for thread T1 is transferred via the PECC1 link. Data for thread T2 is transferred via the PDQ2 link, and ECC for thread T2 is transferred via the PECC2 link. Data for thread T3 is transferred via the PDQ3 link, and ECC for thread T3 is transferred via the PECC3 link. Each of the primary data links (PDQ0-PDQ3) is 16 bits wide. Each of the primary ECC links (PECC0-PECC3) is 2 bits wide.

The memory controller 102 initiates data transfer operations by transmitting command and address information over the PCA link and selecting one of the threads for the data transfer operation using the four active-low select signals S00#, S01#, S10#, and S11#. For example, thread T0 is selected if S00# is asserted, thread T1 is selected if S01# is asserted, thread T2 is selected if S10# is asserted, and thread T3 is selected if S11# is asserted. In some embodiments, there may be a different number of chip select signals. For example, there may only be two physical chip select signals. To derive four logical chip selects, the two physical chip select signals may be combined with a row address bit or bank address bit. Deriving the chip selects in this manner is sometimes referred to as rank multiplication.

Each memory device 120 is an x4 memory device that supports a 4 bit wide interface. Four of the memory devices 120-D0 form a quarter rank QR0 of memory devices that store data for thread T0. Four of the memory devices 120-D1 form another quarter rank QR1 of memory devices that store data for thread T1. Four of the memory devices 120-D2 form a quarter rank QR2 of memory devices that store data for thread T2. Four of the memory devices 120-D3 form another quarter rank QR3 of memory devices that store data for thread T3. Quarter ranks QR0 and QR1 form a half rank HR0 of memory devices. Quarter ranks QR2 and QR3 form another half rank HR1 of memory devices. Memory device 120-E0 is shared between two quarter ranks QR0 and QR1 of memory devices and stores ECC for both thread T0 and T1. Memory device 120-E1 is shared between two quarter ranks QR2 and QR3 of memory devices and stores ECC for both thread T2 and T3.

In this embodiment, the data portion of a thread is 16 bits wide. So a single transaction for the thread consists of four consecutive column operations in order to maintain an overall 64-byte transfer, again assuming BL8 for each column operation. Similarly, since the ECC portion of the thread is 2 bits wide, the four consecutive column operations maintain an overall 8 byte transfer, assuming BL8 for each column operation.

During write transactions, the memory buffer 106 receives the data for one of the threads as four consecutive 16 wide BL8 bursts and writes the data to one of the quarter ranks of memory devices with four consecutive 16 bit wide BL8 bursts. For example, data for thread T0 is received via PDQ0 and written to quarter rank QR0 via SDQ0. However, before the ECC can be written into the shared memory devices 120-E, the packing circuits 108 performs a 1:2 packing of each pair of consecutive 2-bit BL8 bursts to convert the pair into a single 4-bit BL8 burst. For example, packing circuit 108-1 may receive ECC via the PECC0 link as four consecutive 2 bit wide BL8 bursts and then write the ECC to the shared memory device 120-E0 as two 4 bit wide BL8 bursts. So, for every four data column operations, there are two ECC column operations. Read transactions are similar to write transactions, but during read transactions the packing circuits 108 performs a 2:1 unpacking of ECC from the shared memory devices 120-E.

The address circuit 110 is similar to the address circuit described in conjunction with FIG. 1, but the address circuit 110 of FIG. 4 handles communication with a larger number of memory devices 120. Specifically, the address circuit 110 receives four consecutive primary addresses via the PCA link for each memory transaction and re-transmits the addresses as data addresses via the SCA link. The address circuit 110 derives a single error address for the ECC access from each pair of primary addresses. Thus, two error addresses are derived from the four primary addresses. Additionally, to avoid conflicts between the threads, the address circuit 110 derives the error address differently depending on which quarter rank is being accessed for the data. Specifically, the address circuit 110 may use the select inputs S00#, S01#, S10# and S11# to modify one or more of column address bits for the ECC access, or any other indication of the quarter rank being accessed such as row/bank address bits if there are fewer than four chip select signals.

FIGS. 5A and 5B are tables illustrating the operation of the address circuit 110 of the embodiment of FIG. 4, according to an embodiment. Specifically, FIG. 5A illustrates the operation of the address circuit 110 during write transactions for threads T0 and T1. FIG. 5B illustrates the operation of the address circuit 110 during read transactions for threads T0 and T1. Memory transactions are not shown for threads T2 and T3, but are similar to the memory transactions for threads T0 and T1. Both FIGS. 5A and 5B will be explained by reference to FIG. 4.

Referring now to FIG. 5A, shown is a table 500 that illustrates the operation of the address circuit 110 of the embodiment of FIG. 4 during write transactions for thread T0 and thread Ti. The first four rows of the table 500 show consecutive column write operations for thread T0. S00# (active low signal) is asserted and S01# is de-asserted to indicate that the column operations are for thread T0 and quarter rank QR0. The first column operation is to primary column address " . . . xy00", the second column operation is to primary column address " . . . xy01", the third column operation is to primary column address " . . . xy10" and the fourth column operation is to primary column address "xy11." All primary column addresses are received via the PCA link and provided as data addresses via the SCA link to quarter rank QR0 without any changes.

There is no write operation to the shared ECC device 120-E0 during the first column operation since the packing circuit 108 starts the packing process during this period. During the second column operation, the address circuit 110 provides the second primary address of " . . . xy01" as an error address via the ECA link to the shared ECC device 120-E0 without any changes to perform the 8 bit wide burst to the shared ECC device 120-E0. There is no write operation to the shared ECC device 120-E0 during the third column operation since the packing circuit 108-1 restarts the packing process during this period. During the fourth column operation, the address circuit 110 provides the fourth primary address of " . . . xy11" as an error address via the ECA link to the shared ECC device 120-E0 without any changes to perform another 8 bit wide burst to the shared ECC device 120-E0.

The last four rows of the table 500 show consecutive column write operations for thread T1. S01# is asserted and S00# is de-asserted to indicate that column operations are for thread T1 and quarter rank QR1. The first column operation is to primary column address " . . . xy00", the second column operation is to primary column address " . . . xy01", the third column operation is to primary column address " . . . xy10" and the fourth column operation is to primary column address "xy11." All four primary addresses are received via the PCA link and provided as data addresses via the SCA link to quarter rank QR1 without any changes.

As before, there is no write operation to the shared ECC device 120-E0 during the first column operation since the packing circuit 108 starts the packing process during this period. However, during the second column operation, the address circuit 110 inverts the LSB of the primary address and provides this modified column address as the error address via the ECA link to the shared ECC device 120-E0. Thus, column address " . . . xy01" is converted into column address " . . . xy00" for writing ECC to the shared ECC device 120-E. There is no write operation to the shared ECC device 120-E0 during the third column operation since the packing circuit 108 restarts the packing process during this period. During the fourth column operation, the address circuit 110 inverts the LSB of the primary address and provides this modified column address as an error address via the ECA link to the shared ECC device 120-E0. Thus, column address " . . . xy11" is converted into column address " . . . xy10" for writing ECC to the shared ECC device 120-E.

Referring now to FIG. 5B, shown is a table 505 that illustrates the operation of the address circuit 110 during reads. FIG. 5B is similar to FIG. 5A, but now the error address is provided to the shared ECC device 120-E with the first and third column operations so that the packing circuit 108 can start the un-packing process during the first and third column operations. Additionally, the address circuit 110 inverts the LSB of the primary column addresses when generating error addresses for thread T0, and uses the primary column addresses directly without inversion when generating error addresses for thread T1.

Figure 6:
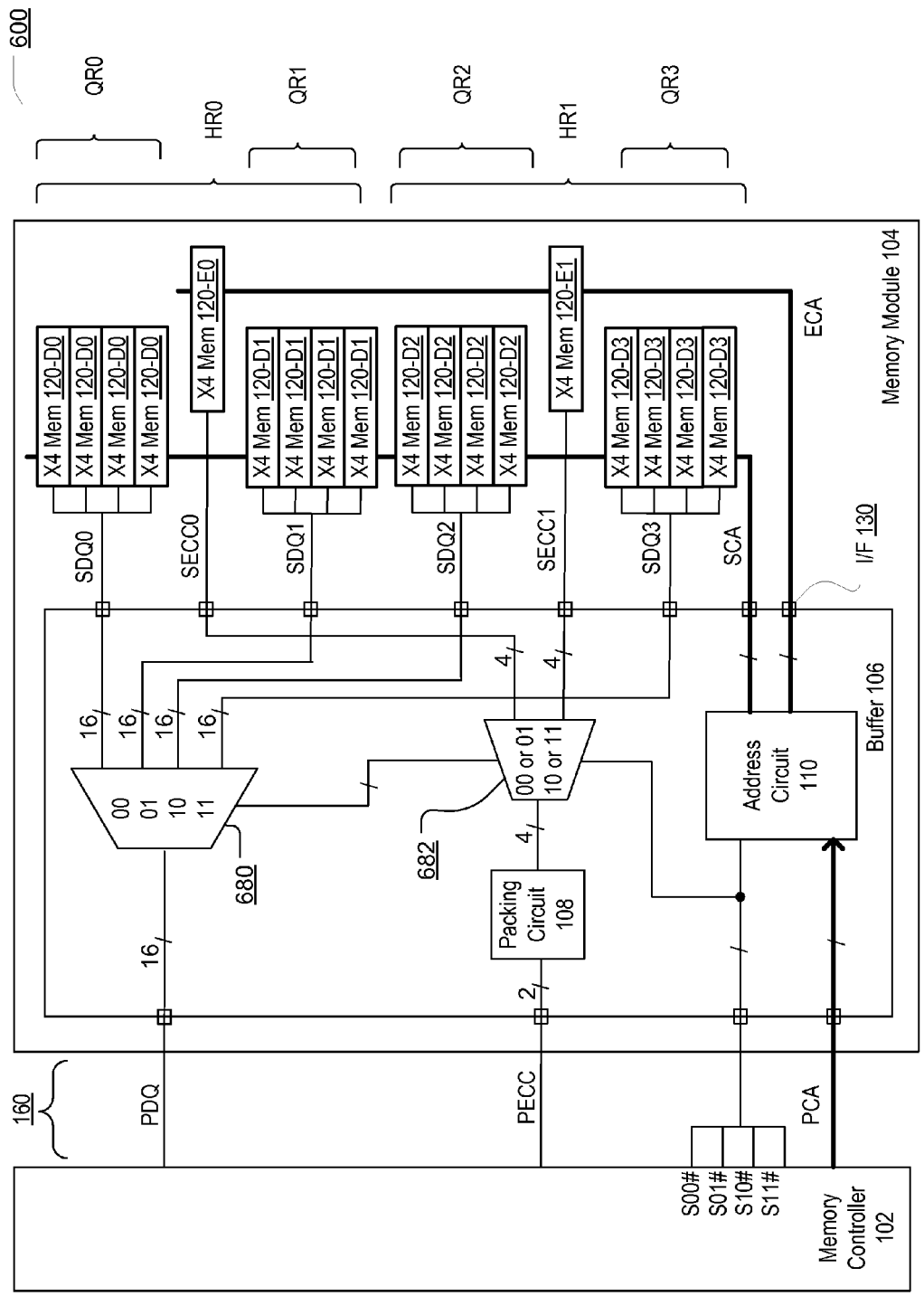
FIG. 6 illustrates a memory system for EDC coverage, according to still another embodiment.

Referring now to FIG. 6, illustrated is a memory system 600 for EDC coverage, according to another embodiment. The memory system 600 is similar to the memory system described in conjunction with FIG. 4. However the memory system 600 of FIG. 6 is an embodiment that supports dynamic point to point (DPP) technology for improved signal integrity. In a DPP system, the memory controller 102 may communicate with each memory module 104 over a narrow point-to-point data link but is still able to access all the memory devices 120 of the memory module 104. For example, the signaling link 160 now includes a single 16 bit wide data link PDQ for transferring data between the memory controller 102 and the memory module 104. The signaling link 160 also includes a primary ECC link PECC for transferring ECC between the memory controller 102 and the memory module 104. The PECC link is 2 bits wide. A system 600 that supports DPP may have several memory modules 104 coupled to the memory controller 102 through their own point-to-point data links, but only one module 104 is shown in FIG. 6 for clarity.

Functionally, the operation of the buffer 106 is similar to that described in conjunction with FIGS. 4, 5A and 5B. The buffer 106 still includes a packing circuit 108 that, during writes, packs pairs of 2 bit wide ECC bursts received via the PECC link into 4 bit wide bursts for transmission to the shared memory devices 120-E. During reads, the packing circuit 108 unpacks 4 bit wide ECC bursts received from the shared memory devices 120-E and transmits them as pairs of 2 bit wide bursts via the PECC link. The buffer 106 also includes an address circuit 110 that receives incoming column addresses via the PCA link and determines column addresses for the ECC accesses. Specifically, the address circuit 110 derives the column addresses for the ECC accesses based on which quarter rank of memory devices 120 is being accessed for the data transfer (as indicated by select signals S00#-S11# or some other indication) and whether the data transfer is a read or write operation 120.

To support DPP operations, the buffer 106 now includes a routing circuit 680 that directs the flow of data between the PDQ link and each of the secondary data links (SDQ0-SDQ3). The routing of data through the routing circuit 680 is configured by the logic levels of the select signals (S00#-S11#) that indicate which quarter rank of memory devices 120-D is selected for the memory transaction. The buffer also includes another routing circuit 682 that directs the flow of ECC between the packing circuit 108 and the secondary ECC links (SECC0 and SECC1). The routing of ECC through the routing circuit 682 is configured by the logic levels of the select signals (S00#-S11#). In one embodiment, the routing circuits 680 and 682 are implemented as bi-directional multiplexers.

Figure 7:
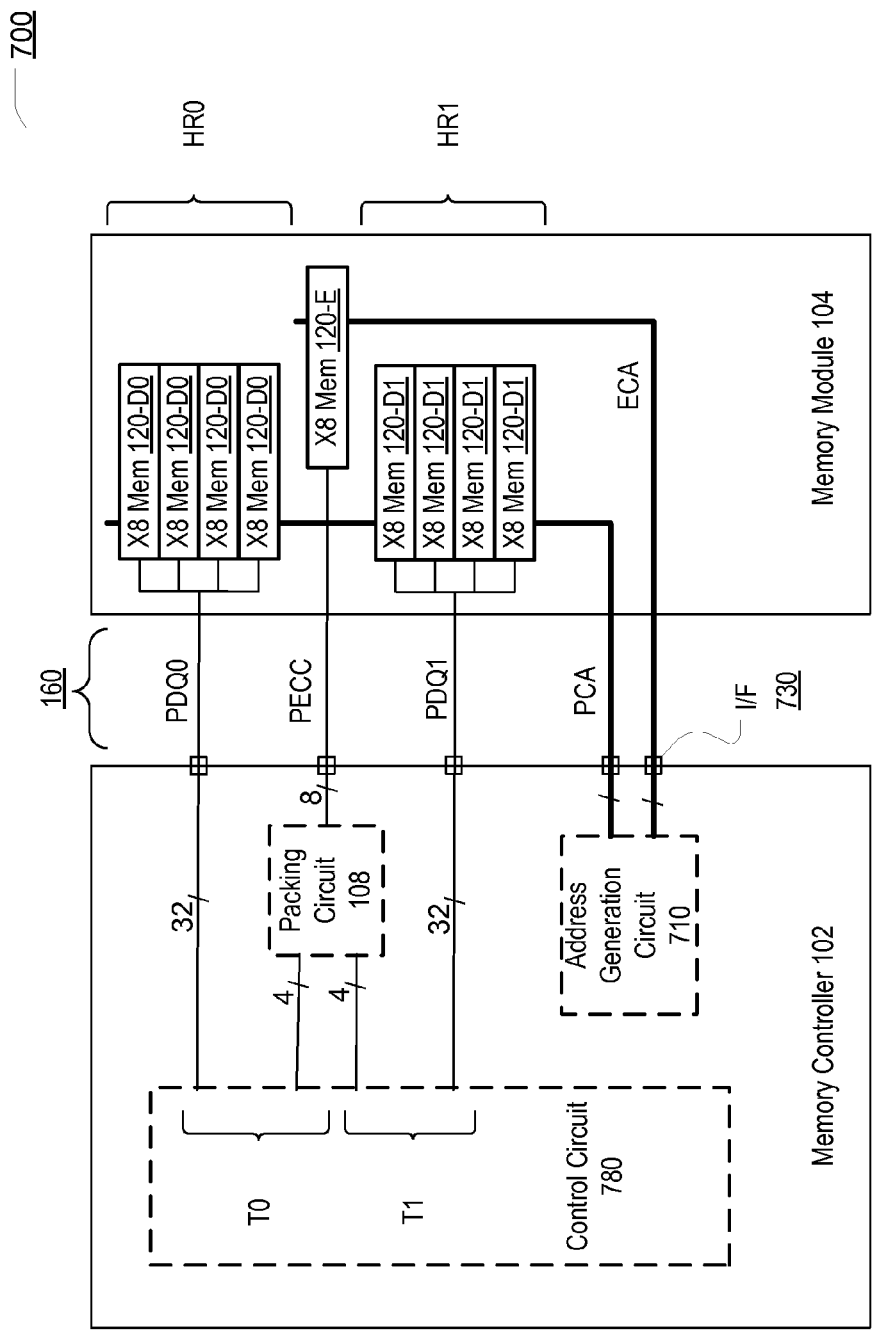
FIG. 7 illustrates a memory system for EDC coverage, according to yet another embodiment.

FIG. 7 illustrates a memory system 700 for EDC coverage, according to yet another embodiment. The memory system 700 of FIG. 7 is similar to the memory system 100 previously described in conjunction with FIG. 1. However, the functionality previously described as being in the memory buffer is located the memory controller 102 itself As a result, the memory system 700 integrates module threading and EDC functionality without the need for a separate memory buffer.

The memory system 100 still includes a memory controller 102 and a memory module 104 that communicate through a signaling link 160. The memory controller also supports two memory threads T0 and T1. However, the signaling link 160 includes an ECC command address link ECA and a single 8 bit wide ECC link PECC. Data addresses are communicated via the PCA link and error addresses are communicated via the ECA link. The signaling link 160 may also includes three select signals (not shown)—one for half rank HR0, one for half rank HR1, and one for the shared ECC device 120-E.

The memory controller 102 includes a control circuit 780, a packing circuit 108, and an address generation circuit 710. The memory controller 102 includes interfaces (e.g., I/F 730) that receives and transmits information over the various communication links (e.g., PDQ0, PDQ1, PECC, PCA, ECA, etc). For example, the memory controller 102 has an interface circuit for communications with half rank HR0 via the PDQ0 link, an interface circuit for communications with the shared memory device 120-E via the PECC link, and an interface circuit for communications with the half rank HR1 via the PDQ1 link. It is understood that any information received by or transmitted from the controller 102 described herein are performed via such interfaces (e.g., I/F 730).

During write operations, the control circuit 780 generates data and ECC for one of the two threads T0 and T1. For a given thread, the packing circuit 108 packs the ECC into an 8 bit wide BL8 burst and transmits the ECC to the memory module 104 via the PECC link. During read operations, the packing circuit 108 unpacks 8 bit wide BL8 bursts of ECC received via the PECC link and provides the unpacked ECC to the control circuit 780. The control circuit 780 then checks any incoming data against the unpacked ECC to detect and correct any memory errors. In other embodiments, the packing circuit 108 is not needed because the control circuit 780 directly generates the 8 bit wide BL8 bursts of ECC on its own.

The memory controller 102 also includes an address generation circuit 710 that is similar to in operation to the address circuit 110 described in conjunction with FIGS. 1, 2A and 2B. However, because the address generation circuit 710 is located in the memory controller 102, it may directly generate column addresses for the column operations. In one embodiment, the address generation circuit 710 generates two data addresses for transferring data with either half rank of memory devices and transmits these addresses via the PCA link. The address generation circuit 710 also generates a single error address for each pair of data addresses and transmits this error address via the ECA link. Thus, there are two data column operations for each ECC column operation.

To allow sharing of the memory device 120-E between the two memory threads T0 and T1, the error address generated by the address generation circuit 710 varies based on whether data is being transferred with half rank HR0 or half rank HR1. For example, during two consecutive column operations the data addresses may be " . . . xyz0" and " . . . xyz1." If the column operations are write operations for thread T0, the address generation circuit 710 may take the second data address of " . . . xyz1" and use this same address as the error address for transferring ECC for thread T0. However, if the column operations are write operations for thread T1, the address generation circuit 710 may invert the LSB of the second data address of " . . . xyz1" to generate error address " . . . xyz0" for transferring the ECC for thread T1.

Several of the disclosed embodiments thus enable advanced memory features such as module threading and DPP to be integrated with EDC capabilities. By sharing an ECC memory device between groups of memory devices, EDC can be used in conjunction with these features without dedicating an ECC memory device to each group of memory devices. Additionally, address conflicts caused by sharing a memory device are avoided by determining addresses for accessing the shared memory device based on which group of memory devices is being accessed for data.

Upon reading this disclosure, those of skill in the art will appreciate still additional alternative designs for sharing a check bit memory device between groups of memory devices. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the spirit and scope of the disclosure as defined in the appended claims.

What is claimed is:

1. A memory module comprising:
first memory chips;
second memory chips;
a third memory chip; and
a memory buffer to transfer first data with the first memory chips, to transfer second data with the second memory chips, and to transfer first error checking information corresponding to the first data with the third memory chip and to transfer second error checking information corresponding to the second data with the third memory chip,
wherein the memory buffer determines an error address indicating a location in the third memory chip corresponding to one of the first error checking information or the second error checking information, the error address determined differently depending on whether the first data is being transferred with the first memory chips or the second data is being transferred with the second memory chips.

2. The memory module of claim 1, wherein the memory buffer receives at least one address for data transfer, and determines the error address by deriving the error address from the received address differently depending on whether the first data is being transferred with the first memory chips or the second data is being transferred with the second memory chips.

3. The memory module of claim 2, wherein the memory buffer determines the error address from the received address by inverting a bit value in the received address if the first data is being transferred with the first memory chips and retaining the bit value if the second data is being transferred with the second memory chips.

4. The memory module of claim 1, wherein the memory buffer transfers the first data by sequentially accessing a first data address and then a second data address, and wherein the memory buffer transfers the first error checking information by:
  if transfer of the first data corresponds to a read operation, accessing the error address substantially simultaneously with accessing the first data address; and
  if transfer of the first data corresponds to a write operation, accessing the error address substantially simultaneously with accessing the second data address.

5. The memory module of claim 1, wherein the memory buffer determines the error address responsive to receiving an indication of whether data transfer is with the first memory chips or the second memory chips.

6. The memory module of claim 5, wherein the indication comprises one or more chip select signals.

7. The memory module of claim 5, wherein the indication comprises one or more address bits.

8. The memory module of claim 1, wherein the memory buffer transfers the first error checking information by receiving the first error checking information at a first bit width and transmitting the first error checking information to the third memory chip at a second bit width that is greater than the first bit width.

9. The memory module of claim 1, wherein the memory buffer transfers the first error checking information by receiving the first error checking information from the third memory chip at a first bit width and transmitting the first error checking information at a second bit width that is smaller than the first bit width.

10. The memory module of claim 1, wherein the third memory chip is shared between the first memory chips and the second memory chips.

11. The memory module of claim 1, wherein the memory buffer comprises a routing circuit receiving data that is one of the first data or the second data and selectively routing the data to either the first memory chips or the second memory chips depending on the whether data transfer is with the first memory chips or the second memory chips.

12. The memory module of claim 1, wherein the error address comprises a column address.

13. A memory buffer device comprising:
  a first interface for transferring first data with first memory chips
  a second interface for transferring second data with second memory chips,
  a third interface for transferring first error checking information corresponding to the first data with a third memory chip and transferring second error checking information corresponding to the second data with the third memory chip; and
  circuitry to determine an error address indicating a location in the third memory chip corresponding to one of the first error checking information or the second error checking information, the error address determined differently depending on whether the first data is being transferred via the first interface or the second data is being transferred via the second interface.

14. The memory buffer device of claim 13, wherein the circuitry receives at least one address for the data transfer and determines the error address by deriving the error address from the received address depending on whether the first data is being transferred via the first interface or the second data is being transferred via the second interface.

15. The memory buffer device of claim 14, wherein the circuitry determines the error address from the received address by inverting a bit value in the received address if the first data is being transferred via the first interface and retaining the bit value if the second data is being transferred via the second interface.

16. The memory buffer device of claim 13, wherein the circuitry transfers the first data by sequentially accessing a first data address and then a second data address, and wherein the circuitry transfers the first error checking information by:
  if transfer of the first data corresponds to a read operation, accessing the error address substantially simultaneously with accessing the first data address;
  if transfer of the first data corresponds to a write operation, accessing the error address substantially simultaneously with accessing the second data address.

17. The memory buffer device of claim 13, wherein the circuitry determines the error address responsive to receiving an indication of whether data transfer is via the first interface or second interface.

18. The memory buffer device of claim 17, wherein the indication comprises one or more chip select signals.

19. The memory buffer device of claim 17, wherein the indication comprises one or more address bits.

20. The memory buffer device of claim 13, wherein the circuitry transfers the first error checking information by receiving the first error checking information at a first bit width and transmitting the first error checking information via the third interface at a second bit width that is greater than the first bit width.

21. The memory buffer device of claim 13, wherein the circuitry transfers the first error checking information by receiving the first error checking information via the third interface at a first bit width and transmitting the first error checking information at a second bit width that is smaller than the first bit width.

22. A memory controller comprising:
  a first interface for transferring first data with first memory chips; and
  a second interface for transferring second data with second memory chips;
  a third interface to transfer first error checking information corresponding to the first data with a third memory chip and to transfer second error checking information corresponding to the second data with the third memory chip; and
  circuitry to determine an error address indicating a location in the third memory chip corresponding to one of the first error checking information or the second error checking information, the error address determined differently depending on whether the first data is being transferred via the first interface or the second data is being transferred via the second interface.

23. The memory controller of claim 22, wherein the circuitry accesses at least one address for data transfer of one of the first data or the second data; and wherein a bit value in the error address is inverted from a corresponding bit value in the accessed address if the first data is being transferred via the first interface and the bit value in the error address is the same as the corresponding bit value in the accessed address if the second data is being transferred via the second interface.

24. The memory controller of claim 22, wherein the circuitry transfers the first data by sequentially accessing a first data address and then a second data address, and wherein the circuitry transfers the error checking information by:
  if transfer of the first data is a read operation, accessing the error address substantially simultaneously with accessing the first data address;

if transfer of the first data is a write operation, accessing the error address substantially simultaneously with accessing the second data address.

25. A method of operation in a memory buffer device that supports transferring first data with first memory chips, transferring second data with second memory chips, transferring first error checking information for the first data with a third memory chip, and transferring second error checking information of the second data with the third memory chip, the method comprising:
receiving, at the memory buffer device, an indication of whether to transfer the first data with the first memory chips or to transfer the second data with the second memory chips; and
responsive to the indication of whether to transfer the first data with the first memory chips or to transfer the second data with the second memory chips, determining an error address indicating a location in the third memory chip corresponding to one of the first error checking information or the second error checking information, the error address determined differently depending on whether the first data is to be transferred with the first memory chips or the second data is to be transferred with the second memory chips.

26. The method of claim 25, further comprising:
receiving at least one address for data transfer, and
wherein determining the error address comprises deriving the error address from the received address differently depending on whether the first data is to be transferred with the first memory chips or the second data is to be transferred with the second memory chips.

27. The method of claim 26, wherein deriving the error address from the received address comprises inverting a bit value in the received address if first data is to be transferred with the first memory chips and retaining the bit value if the second data is to be transferred with the second memory chips.

28. The method of claim 25, further comprising:
transferring the first data with the first memory chips by sequentially accessing a first data address and then a second data address; and
transferring the first error checking information with the third memory chips by:
if transfer of the first data corresponds to a read operation, accessing the error address substantially simultaneously with accessing the first data address;
if transfer of the first data corresponds to a write operation, accessing the error address substantially simultaneously with accessing the second data address.

29. The method of claim 25, further comprising receiving the first error checking information at a first bit width and transmitting the first error checking information to the third memory chip at a second bit width that is greater than the first bit width.

30. The method of claim 25, further comprising receiving the first error checking information from the third memory chip at a first bit width and transmitting the first error checking information at a second bit width that is smaller than the first bit width.

31. A method of communicating with memory chips, the method comprising:
transferring first data with first memory chips;
transferring second data with second memory chips;
transferring first error checking information corresponding to the first data with a third memory chip; and
transferring second error checking information corresponding to the second data with the third memory chip;
wherein an error address indicating a location in the third memory chip corresponding to one of the first error checking information or the second error checking information is determined differently depending on whether the first data is being transferred with the first memory chips or the second data is being transferred with the second memory chips.

32. The method of claim 31, wherein at least one address is accessed during data transfer, and the error address is determined by inverting a bit value in the accessed address if the first data is being transferred with the first memory chips and retaining the bit value if the second data is being transferred with the second memory chips.

33. The method of claim 31, wherein the first data is transferred by sequentially accessing a first data address and then a second data address, and the first error checking information is transferred by:
if transfer of the first data corresponds to a read operation, accessing the error address substantially simultaneously with accessing the first data address;
if transfer of the first data corresponds to a write operation, accessing the error address substantially simultaneously with accessing the second data address.

34. The memory module of claim 1, wherein the first memory chips and second memory chips belong to a same memory rank.

* * * * *